(12) United States Patent
Hathaway et al.

(10) Patent No.: US 6,986,090 B2
(45) Date of Patent: Jan. 10, 2006

(54) METHOD FOR REDUCING SWITCHING ACTIVITY DURING A SCAN OPERATION WITH LIMITED IMPACT ON THE TEST COVERAGE OF AN INTEGRATED CIRCUIT

(75) Inventors: David J. Hathaway, Underhill Center, VT (US); Brion L. Keller, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 10/078,876

(22) Filed: Feb. 20, 2002

(65) Prior Publication Data

US 2003/0182604 A1    Sep. 25, 2003

(51) Int. Cl.
*G01R 31/28* (2006.01)
(52) U.S. Cl. .................. 714/727; 714/728; 714/729
(58) Field of Classification Search ............... 714/726, 714/727, 729, 728, 738
See application file for complete search history.

(56) References Cited

U.S. PATENT DOCUMENTS 6,529,861 B1 * 3/2003 Patra et al. ................ 703/14

OTHER PUBLICATIONS

J. Monteiro, S. Devadas, and B. Lin, "A Methodology for Efficient Estimation of Switching Activity in Sequential Logic Circuits," Proc. 31st Design Automation Conf., pp. 12-17, 1994.*
Seiji Kajihara, Kohei Miyase: On Identifying Don't Care Inputs of Test Patterns for Combinational Circuits. ICCAD 2001: 364-369.*
S. T. Chakradhar, A. Balakrishnan, and V. D. Agrawal, "An exact algorithm for selecting partial scan flip-flops", Design Automation Conference, pp. 81-86, 1994.*

* cited by examiner

*Primary Examiner*—Joseph D. Torres
(74) *Attorney, Agent, or Firm*—H. Daniel Schnurmann

(57) ABSTRACT

A method for reducing the switching activity during both scan-in and scan-out operations of an integrated circuit with reduced detrimental effect on test pattern effectiveness and test time is described. The method makes use of a sample set of patterns to determine the probabilities of same and opposite relationships between stimulus and result values, and uses these probabilities to determine memory element pair compatibilities. Scan chains are ordered preferentially by connecting adjacently compatible memory elements, and inversions are inserted between selected memory element pairs based on those probabilities. Unspecified stimulus bits are filled in to reduce the switching activity based on the scan chain ordering and inversions.

21 Claims, 4 Drawing Sheets

Initial (bad) scan chain order

Optimized scan chain order

METHOD FOR REDUCING SWITCHING ACTIVITY DURING A SCAN OPERATION WITH LIMITED IMPACT ON THE TEST COVERAGE OF AN INTEGRATED CIRCUIT

FIELD OF THE INVENTION

The invention is related to the field of Electronic Design Automation, and more particularly, to a method of reducing the switching activity during a test scan operation of an integrated circuit (IC) by optimizing the scan design of the IC.

BACKGROUND OF THE INVENTION

Testing semiconductor chips requires applying test patterns to the IC chip and examining the results of the chip logic operating on those patterns. To introduce patterns to logic fed by memory elements (e.g., latches or flip-flops), scan techniques (such as Level-Sensitive Scan Design (LSSD), Boundary scan, etc.) are often used, wherein the memory elements on the chip are connected to each other in one or more scan chains, such that test patterns can be loaded in via the scan chain and applied to the logic under test. Similarly, this scan chain can be used to read out logical results of logic feeding memory elements.

Current draw and power consumption of a chip are primarily influenced by the amount of switching activity on the chip (i.e., the number of signal nets on the chip switching). During normal operation switching activity is often low (e.g., around 10% or less of the nets switching per cycle). During test, however, this activity is usually much larger due to the nature of the patterns applied. Scan test can exacerbate this situation, as a typical test pattern will not have any correlation between the data bits applied to successive memory elements in the scan chain. Thus, each memory element has a 50% probability of switching in any given scan cycle. This can be problematic, since power consumption and current draw can be limiting constraints on the ability to test a chip.

The power consumed during scan operation on average can be reduced by slowing down the rate at which scan cycles are applied. This has a negative impact onto the test time and does not solve the problem of instantaneous current variation, also known as delta-I. The delta-I problem occurs when the instantaneous switching activity is high during a specific event, and this high current is much higher than the current required by the device during the time period leading up to this high current event. This phenomena creates certain undesired effects, e.g., the power supplies in the automated test equipment (ATE) cannot respond quickly enough to the new current demand, resulting in a drop in the on-chip power supply voltage (Vdd), and the chip ground supply (Vss) moves up from a near 0 volt expected value due to the many nodes being discharged into ground during switching. Because Vdd drops and Vss increases, their difference shrinks drastically. When Vdd and Vss become too close to each other, a situation called power droop ensues, and the circuitry will begin to fail. When non-defective circuits do not function properly, the tests become invalid since both good and bad chips will fail. If the power droop is large, but not so large that the circuits begin to fail, they will operate at a much slower rate because it will generally take longer to reach the threshold voltage for a transistor to recognize a transition on its input. This again can be mitigated during scanning by simply slowing down the scan rate to allow the circuits enough time to recover from the high current spike which is seen in each scan shift cycle. However, when applying an at-speed test, one cannot afford to insert an added delay between a launch clock event and a capture clock event since that will greatly reduce the effectiveness, and even the purpose of such an at-speed test. For most at-speed scan-based tests created today, the launch clock event which stores the stimulus values for a test pattern into the memory elements is the last scan shift cycle, though it is certainly possible to use a system functional path to launch new values for an at-speed test. Although a typical test pattern has the previously mentioned attribute of approximately 50% switching during any given scan cycle, the actual scan chain elements which are set to particular values to test for a particular fault, or even for a set of faults, are typically a small fraction (less than 10%) of those on the chip. The values taken by these scan chain elements are called care bits since they are the only bits that matter when testing for their targeted faults. The remaining scan chain elements (whose values are called don't care bits) are typically loaded with random values to help in the accidental detection of non-targeted faults. Fault simulation is then used to determine which other faults have been detected by the pattern.

One method which has been used to reduce the entropy or randomness of the scan test data, and hence the switching activity during scan in of test pattern data, is to fill the don't care bits of a test pattern with repeating values based on the required care bits rather than random data (a "repeat-fill" method). The repeating values used in this context are values which result from the same scan chain input value. Thus if two memory elements are connected sequentially in a chain with no intervening inversion, the repeat-fill method will generate the same value for these two memory elements, while if two memory elements are connected sequentially in a scan chain with an intervening inversion, the repeat fill method will generate opposite values for these two memory elements. The value used to fill a sequence of don't care bits in a scan chain may be the same value (taking into account inversions) as either the preceding or following care bit in the scan chain. By using repeating values along the scan chains, the relative entropy of the scan data is greatly reduced compared with random filling, with the resulting test data being highly compressible. It has also the benefit of causing a correlation between values in consecutive memory elements in the scan chain, thus reducing switching activity when test patterns are scanned in and also when a scan cycle is used to launch new values during an at-speed test. Unfortunately, it has also the effect of reducing the number of faults detected by a given test pattern since the repeating values tend to detect fewer faults by accident compared with randomly filled scan data. This will typically result in a need for more test patterns to achieve the same fault coverage that is possible when using random-fill, resulting in longer test application times. It also does not help to reduce the switching activity when test results are scanned out, since that is a result of the functional logic operation. Switching activity during scan can also be reduced by blocking memory element outputs from propagating during scan, but this requires a more complex memory element and a blocking signal connection to the memory element (this blocking signal can be the same as a scan enable signal). It also does not reduce the switching activity when new values are launched into the combinational logic under test, nor does it reduce switching activity within the memory element itself It is, therefore, highly desirable to have a method which reduces the switching activity during both scan in and scan out, and which, advantageously, avoids introducing detrimental effects on test pattern effectiveness and test time.

It is known that today's ICs require that during circuit placement when designing an integrated circuit semiconductor chip or module, memory elements that are connected to form scan chains are normally assigned locations on the chip based on their data input and output connections. The scan connections are typically ignored or absent during the placement process and are modified or introduced only after placement to minimize wiring costs. This is possible because the precise ordering of memory elements in a scan chain does not generally affect the chip function and, thus, any specific scan connections present before placement need not be preserved (i.e., it can be interchanged) as long as all memory elements end up in valid scan chains. Since the scan connections may still be changed after placement, there is no reason to let them influence the memory element placement, and by doing so degrade the quality of the placement result by counteracting other more important influences on the memory element placement. Clock connections to memory elements are treated in a like manner for similar reasons, but this is not germane to the present discussion.

Existing methods for ordering memory elements within scan chains following placement work minimize the amount of wiring required to implement the scan chain. Thus, preferably, the scan connections between memory elements are selected to those that are close to each other on the chip. One common scan chain ordering method uses the well-known method of simulated annealing, which makes random changes to a design, accepts all changes which improve a cost function, and also accepts changes which degrade the cost function according to a Boltzmann's probability distribution. This probability distribution is a function of a temperature parameter which is slowly reduced during the simulated annealing process, so that at the beginning of the process cost-degrading moves are more likely to be accepted, and toward the end they are very unlikely to be accepted. In the context of scan chain ordering, the random design changes include interchanging two subsections of a scan chain or of different scan chains and the cost function remains to be the total length of the scan chain. Other considerations such as the desire to balance the lengths of different scan chains may also be included the cost function. Other methods of scan chain ordering are also used, but all of them aim at reducing the scan chain length.

Figure 1:
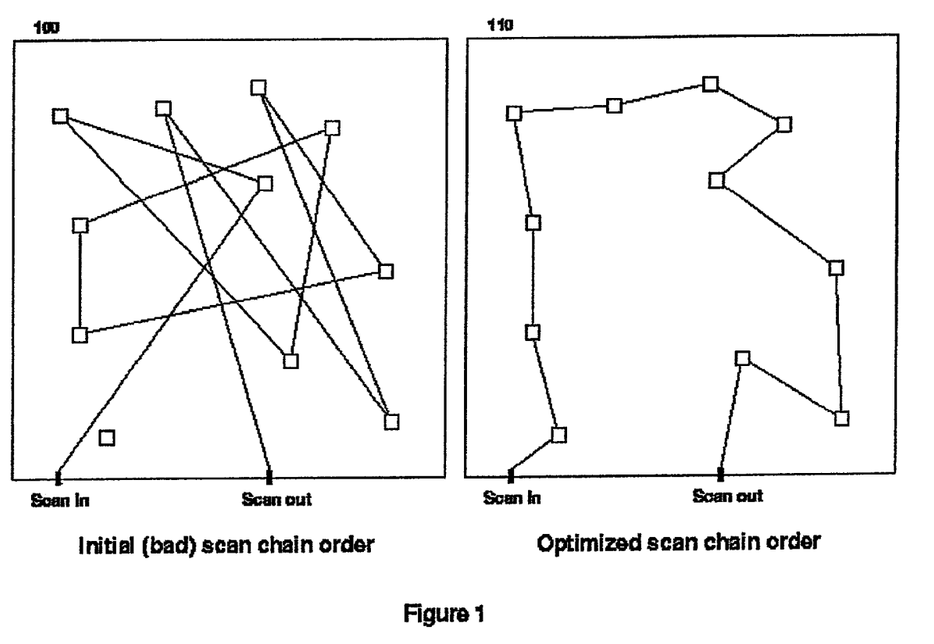
FIG. 1 is a schematic diagram of a chip before and after scan optimization, showing a bad (initial) and a good (optimized) scan chain order.

An example of this process is shown in FIG. 1, wherein chip 100 is shown before scan chain optimization and chip 110, after the scan chain optimization. The memory elements of the design are represented by the small squares within chip 100, and the lines interconnecting these squares represent the inter-memory element scan chain connections of an initial scan chain ordering. The actual routing of the wires which implement the scan chain connections would, in general, follow a rectilinear path, in which only vertical and horizontal wire segments are used. Thus, the interconnecting lines in chip 100 are intended to represent scan chain connectivity, and not actual wiring routes. The squares and connecting lines in chip 110 represent the memory elements of chip 100 and the inter-memory element scan chain connections, respectively, after a scan chain reordering process has been performed. It can be seen that the initial connections of chip 100 which were made without regard to the physical locations of the memory elements form a scan chain which is much longer than that formed by the optimized connections of chip 110.

OBJECTS OF THE INVENTION

Thus, it is an object of the invention to provide a method for reducing the switching activity during both scan-in and scan-out operations of an integrated circuit with reduced detrimental effect on test pattern effectiveness and test time.

It is another object to provide a method for optimizing the scan chains in an integrated circuit by ordering the scan chain to preferentially connect memory elements whose stimulus values in the test patterns and result values in the test patterns are predominantly the same adjacent to other memory elements whose stimulus and result values in test patterns are predominantly the same.

It is still another object to provide a method for optimizing the scan chains in an integrated circuit by ordering the scan chains to preferentially connect memory elements whose stimulus and result values are predominantly opposite adjacent to other memory elements whose stimulus and result values are predominantly opposite.

It is yet another object to provide a method to ensure that no inversion is present in the scan chains between memory elements whose stimulus values are predominantly the same and whose result values are predominantly the same.

It is a further object to provide a method to insert an inversion in the scan chains between memory elements whose stimulus values are predominantly opposite and whose result values are predominantly opposite.

It is a more particular object to replace don't care stimulus values in test patterns with values which reduce the switching activity during scan in of the stimulus values and scan out of the result values and which are likely to detect additional faults.

It is still a further object to provide an alternate method for determining during the scan chain ordering and inversion insertion process, the maximum current required by any one of a set of precomputed test patterns by tracking the number of switching events required during scan-in and scan out of each pattern, and preferentially choosing an ordering and set of inversion which minimizes this maximum current.

SUMMARY OF THE INVENTION

In a first aspect of the invention, there is provided a method for using statistical information about which value in a particular scan memory element will be likely to contribute to the detection of more faults, and about which value is most likely to be captured into a scan memory element. This information is used to influence the ordering of memory elements in the scan chain (in addition to their physical location on the chip), and to determine where to place inversions within the scan chain.

The stimulus values applied to a particular memory element often have a tendency to be the same in a majority of the test patterns for which that memory element is assigned a stimulus value. By assigning the opposite stimulus value to the memory element, it may cause it to control the value of one or more gates, thereby blocking the observability of faults in the cone of logic feeding the other input(s) of those gates. Similarly, the result values that are stored in a memory element often have a tendency to be the same in a majority of test patterns. It generally takes only one pattern to test for all faults which impose a controlling stuck-at value on any input of an N-input gate (e.g., a stuck-at-0 fault for an AND gate), by applying the non-controlling value to all gate inputs (e.g., a 1 for an AND gate), and this pattern produces the non-controlled output value for the gate (e.g., a 1 for an AND gate). In contrast, it takes N patterns to test for all faults which impose a non-controlling stuck-at value on a gate input (e.g., a stuck-at 1 fault for an AND gate), each applying the controlling value to one gate input (e.g., 0 for an AND gate) and the non-controlling input to all other gate inputs, and each of these generating a controlled output value for the gate under consideration (e.g., a 0 for an AND gate). Thus, for each memory element, a specific stimulus value may be more likely to contribute to fault detection, and a particular result value may be more likely to be occur in any given test pattern.

Scan chain elements are classified according to whether the best stimulus value for the element (the value most likely to contribute to fault detection) is the same as or is the opposite of the most likely result value to be captured into the memory element as a result of the test pattern application. That is, memory elements whose best stimulus value and most likely result value are (0, 0) or (1, 1) are grouped together, and those whose best stimulus value and most likely result value are (0, 1) or (1, 0) are grouped together. The scan chain is preferentially ordered so that memory elements whose best stimulus value and most likely result value are the same are connected consecutively in the scan chain(s), and those whose best stimulus value and most likely result value are opposite are connected consecutively in the scan chain. Inversions are then introduced between consecutive elements in the scan chain whose best stimulus values are opposite and whose most likely result values are opposite, i.e., between memory elements whose best stimulus value and most likely result value are (0, 0) and (1, 1), or are (0, 1) and (1, 0). It should also be ensured that there is no inversion between consecutive scan chain elements whose best stimulus values are equal and whose most likely result values are also equal. For consecutive scan chain elements for which either the best stimulus values are equal and the most likely result values are opposite, or the most likely result values are equal and the best stimulus values are opposite, an inversion between the scan elements will help for either scanning in or scanning out, but will not help for both. Thus, it is not required to insert or remove inversion for these cases. And the above-mentioned preferential connection of elements which are grouped together will reduce the number of such cases. If in certain designs the scan-in (scan-out) switching is more of a problem than the scan-out (scan-in) switching, a priority for scan-in (scan-out) can be used to decide whether inversion will have a net beneficial effect in these cases. Finally, test patterns are generated using the repeat-fill method for the don't care bits.

In a second aspect of the invention, there is provided a method for optimizing at least one scan chain in the IC The method includes the following combination of steps:

The best stimulus value and the most likely result value for each memory element are first determined. The best pattern value can be determined by performing automatic test pattern generation (ATPG) on a small sample (1% to 5%) of the faults, keeping track of the number of times a scan element was needed to be a 0 and 1. The most likely result value can be estimated from either signal probability analysis or from actually simulating ATPG vectors.

The scan chains are then ordered, preferentially by placing consecutively in the scan chain memory elements whose best stimulus value and most likely result value are the same, and those whose best stimulus value and most likely result value are opposite.

Inversions are introduced in the scan chain between consecutive memory elements in the scan chain whose best stimulus values are opposite and whose most likely result values are opposite. Test patterns are then generated using the repeat-fill method. As a result, the switching activity during scan will be greatly reduced and the instantaneous current required for the launch cycle of an at-speed test will also be greatly reduced. Since the best stimulus values are actually more likely to be produced by the repeat-fill method after such an ordering, it is expected that there will not be any significant reduction in the accidental detect rate of the test patterns and it may in fact even be better than random-fill.

The aforementioned method can also be used for Logic Built-In Self Test (LBIST) using a conventional STUMPS scan architecture. STUMPS is a compound acronym for Self Test Using MISR and Parallel SRSG. MISR is an acronym for Multiple Input Signature Register. SRSG stands for Shift Register Sequence Generator. It has been shown that additional fault coverage can be obtained over and above simple random values by weighting the inputs to the STUMPS channels, each of which is a scan chain on the chip. When all scan elements within the same channel have been arranged to have identical best stimulus values through the scan paths (including inversion where best values are opposite), then a channel weight toward the best value designations for each channel provides an improved fault coverage in addition to a reduced switching activity.

In a third aspect of the invention, the care bits are accounted for when test patterns are combined during automatic test pattern generation (ATPG) as part of the test pattern compaction. This combining process takes two or more test patterns which have no conflicts in their care bits (i.e., memory elements for which one pattern from the set to be merged has a 1 and some other pattern from the set has a 0) and replaces them by a single test pattern which combines the care bits of all the merged patterns. If the entropy (the switching activity during scan in) for a test vector produced by such a merging exceeds some threshold, then that merging is rejected. This will further ensure that the tests produced by ATPG will not cause excessive switching during scan and at-speed testing.

In a fourth aspect of the invention, a check is made for scan vector entropy during simulation of the test patterns. If a given test scan input vector or scan output vector switches more than some threshold amount, the test vector can be discarded, in a fashion similar to what is typically done for test patterns which cause tri-state bus contention.

BRIEF DESCRIPTION OF THE DRAWINGS

These and other objects, aspects and advantages of the invention will become apparent form the detailed description of the invention when taken in conjunction with the accompanying drawings, in which.

DETAILED DESCRIPTION OF THE INVENTION

Considering a pair of memory elements to which certain stimulus values are applied and into which certain result values are stored for each set of precomputed test patterns, there are 16 possible combinations of stimulus and result values that can occur in any given test pattern, assuming that all stimulus and result values involved are specified (i.e., they are not don't care stimuli or undetermined results). If the pair of memory elements are connected adjacently in a scan chain, there will be a switching event propagated through the scan chain as the stimulus values for the two memory elements are scanned-in if they are to be loaded with opposite stimulus values with no intervening inversion between the two memory elements in the scan chain, or if they are to be loaded with the same stimulus values and there is an intervening inversion between the two memory elements in the scan chain. Similarly, there will be a switching event propagated through the scan chain as the result values for the two memory elements are scanned-out if they have opposite result values and there is no intervening inversion between the two memory elements in the scan chain, or if they have the same result values and there is an intervening inversion between two memory elements in the scan chain. The stimulus and result values are considered to be compatible if either the insertion or omission of an intervening inversion prevents a switching event from occurring during both stimulus and result scanning. These 16 cases are tabulated below for a pair of memory elements A and B. It can be seen that in 4 of the 16 cases, the memory elements are compatible if connected sequentially without an intervening inversion; in another 4 of the 16 cases, the memory elements are compatible if they are connected sequentially with an intervening inversion. Finally, in the remaining 8 of the 16 cases, the memory elements are not compatible for sequential connection in a scan chain. Here sA and rA are the stimulus and result values for memory element A, and sB and rB are the stimulus and result values for memory element B.

Many test patterns are generally applied to an integrated circuit, each with different stimulus and result values. However, the integrated circuit will have a single scan chain ordering and set of intervening inversions between memory elements through which all stimulus and result values are scanned. Thus, one must consider the probabilities that a pair of adjacently connected memory elements will cause a switching event during stimulus scan-in or result scan-out. It is intended that the scan chain be connected such that for most test patterns, the stimulus and result values for most of the adjacently connected memory elements are compatible either with or without intervening inversion in the majority of test patterns. By doing this, one may reduce the switching activity during both stimulus scan-in and result scan-out.

The present invention modifies the ordering of scan chains performed by prior art scan chain ordering methods by altering the effective inter-memory element distances used by these methods. This is achieved by converting the affinity between a pair of memory elements, according to their probability of compatibility, to a number between 1 and a maximum value M. This number is then multiplied by the actual distance between the two memory elements and this distance is then used for ordering the scan chains. By way of example, two memory elements with high affinity are given a distance multiplier of 1.0 and, thus, the distance separating them is not modified. Two memory elements with a low affinity are assigned a distance multiplier of M and, thus, will appear to the scan chain ordering algorithm to be farther apart than they really are. Thus, they are deemed to be unlikely candidates to be connected adjacently in the scan chain. The value of M represents a trade off between the desire to minimize actual wire lengths and the desire to reduce switching during scan.

One way of determining the affinity between memory elements is to first calculate the probability that its stimulus and result value will be equal for each memory element. This can be achieved by examining a set of test patterns generated for a small sampling of the faults on the chip and identifying those for which the stimulus value for the memory element is specified (i.e., a "care" value) and for which the result value for the memory element is determined (i.e., takes on a known value as a result of the "care" values of the pattern). The probability that the stimulus and result value for the

| Case | sA | rA | sB | rB | SA = rA | sB = rB | sA = sB | rA = rB | Comp. w.out inv. | Comp. with inv. |
|---|---|---|---|---|---|---|---|---|---|---|
| 1 | 0 | 0 | 0 | 0 | yes | yes | yes | yes | yes | no |
| 2 | 0 | 0 | 0 | 1 | yes | no | yes | no | no | no |
| 3 | 0 | 0 | 1 | 0 | yes | no | yes | no | no | no |
| 4 | 0 | 0 | 1 | 1 | yes | yes | no | no | no | yes |
| 5 | 0 | 1 | 0 | 0 | no | yes | yes | no | no | no |
| 6 | 0 | 1 | 0 | 1 | no | no | yes | yes | yes | no |
| 7 | 0 | 1 | 1 | 0 | no | no | no | no | no | yes |
| 8 | 0 | 1 | 1 | 1 | no | yes | no | yes | no | no |
| 9 | 1 | 0 | 0 | 0 | no | yes | no | yes | no | no |
| 10 | 1 | 0 | 0 | 1 | no | no | no | no | no | yes |
| 11 | 1 | 0 | 1 | 0 | no | yes | yes | yes | yes | no |
| 12 | 1 | 0 | 1 | 1 | no | yes | yes | no | no | no |
| 13 | 1 | 1 | 0 | 0 | yes | yes | no | no | no | yes |
| 14 | 1 | 1 | 0 | 1 | yes | no | yes | no | no | no |
| 15 | 1 | 1 | 1 | 0 | yes | no | yes | no | no | no |
| 16 | 1 | 1 | 1 | 1 | yes | yes | yes | yes | yes | no | memory element will be the same may then be estimated as the fraction of the identified test patterns in which the stimulus and result values for the memory element are equal. Given the probabilities for a pair of memory elements A and B with respective probabilities pA and pB of having their stimulus and result values equal, one may then compute a modified distance between them D'(A,B), which is reported to the scan chain ordering algorithm, where $$D'(A,B)=D(A,B)\{1+K[pA(1-pB)+pB(1-pA)]\}$$

where D(A,B) is the unadjusted distance, and K is a constant equal to M−1. If pA is high and pB is low, the term pA(1−pB) will be large, leading to a larger modified distance. These conditions correspond to a high likelihood of cases 2, 3, 14, or 15 in the table above, each of which is seen to be a case where the memory elements are not compatible for a sequential scan chain connection. Similarly, if pA is low and pB is high, the term pB(1−pA) will be large, leading to a larger modified distance. These conditions correspond to a high likelihood of cases 5, 8, 9, or 12 in the table above, each of which is seen to be a case where the memory elements are not compatible for sequential scan chain connection. However if both pA and pB are high or both pA and pB are low, the memory elements values are likely to be compatible, and the modified distance will be close to the unmodified distance.

In certain instances, it occurs that the probability that the stimulus and result values for a particular memory element are equal is about 50%, and thus no determination can be made regarding whether it is beneficial or detrimental to connect it sequentially in a scan chain with another memory element. However, when its stimulus and result values in each individual test pattern are compared with those for the other memory element, a correlation is seen which can help to determine whether the particular pair of memory elements should be connected sequentially in a scan chain. An example is shown in FIG. 2.

Figure 2:
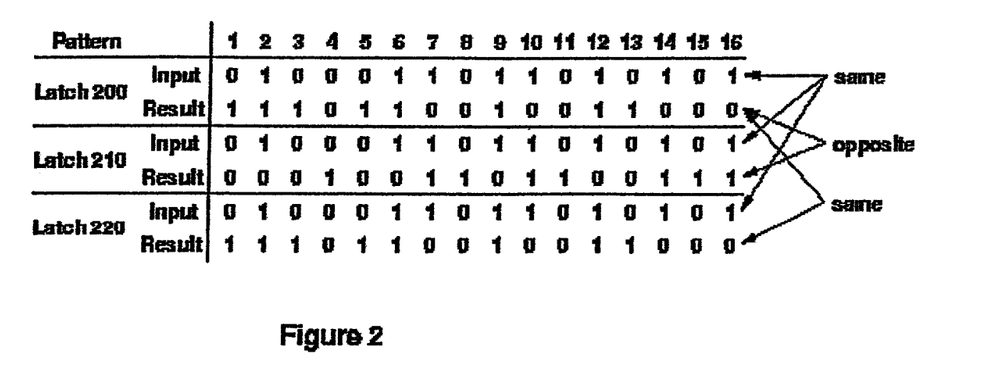
FIG. 2 is a prior art example representing the input (or stimulus) result values of three latches for a variety of test patterns respectively applied to them, these values being used to compute probabilities serving as a basis to make decisions whether or not to connect the latches adjacently in the scan chain.

Referring now to FIG. 2, for each of the three latches the stimulus (input) and result values match in exactly 8 of the 16 test cases and, thus, the estimated probabilities that their stimulus and result values match is 50%. However, if one were to look at the relationships between the values for different latches in each testcase, it may be seen that memory element 200 always takes the same input value and the opposite result value as memory element 210 and, likewise, the same input value and the same result value as memory element 220 in each case. Thus, connecting memory element 200 and 210 adjacently in a scan chain without inversion results in a switching event to occur during scan-out for each test pattern. Alternatively, connecting them adjacently in a scan chain with an inversion results in switching to occur during scan-in for every test pattern. Accordingly, connecting them adjacently in a scan chain is not desirable. In contrast, connecting memory element 200 and 220 adjacently in a scan chain with no inversion causes no switching during either scan-in or scan-out, and is, thus, preferable.

Thus, an alternate method for determining the affinity of a pair of memory elements considers a pairwise correlation between memory elements. It begins by examining a set of test patterns generated for a small sampling of the faults on the chip and identifying those for which the stimulus value for both memory elements of the pair are specified. The fraction of these cases in which the stimulus values are the same is an estimate of psm, the probability that the stimulus values of the two memory elements will be the same in a test pattern. By way of example, if there are 1000 test patterns in which the stimulus values for both A and B are specified and the stimulus values for a pair of memory elements A and B are the same for 892 of these patterns, the probability psm that the stimulus values are the same is 0.892. The set of test patterns is then examined to identify those for which the result values for both memory elements of the pair are determined. The fraction of these cases in which the result values are the same is an estimate of prm, the probability that the result values of the two memory elements will be the same in a test pattern. Given these probabilities for a pair of memory elements, one may compute a modified distance D'(A,B) between them, which is reported to the scan chain ordering algorithm, wherein $$D'(A,B)=D(A,B)\{1+K[psm(1-prm)+prm(1-psm)]\}$$

where D(A,B) is the unadjusted distance, and K is a constant equal to M−1. It can be seen that if psm is high and prm is low, the term psm(1−prm) will be large, leading to a larger modified distance. These conditions correspond to a high likelihood of cases 2, 5, 12, or 15 in the table above, each of which is seen to be a case where the memory elements are not compatible for sequential scan chain connection. Similarly, if psm is low and prm is high, the term prm(1−psm) will be large, again leading to a larger modified distance. These conditions correspond to a high likelihood of cases 3, 8, 9, or 14 in the table above, each of which is seen to be a case where the memory elements are not compatible for sequential scan chain connection. However if both psm and prm are high or both psm and prm are low, the memory elements values are likely to be compatible, and the modified distance will be close to the unmodified distance. One disadvantage of this method is that one needs to compute modified distances between all pairs of memory elements, and thus must either examine all the test patterns every time when a distance is requested by the scan chain ordering algorithm, or precompute psm and prm values for all the memory element pairs which requires a large amount of memory if the chip has a significant large number of memory elements.

Once a scan chain order has been determined, it is necessary to ensure that inversions appear where needed between sequential scan chain element. If the method of pairwise correlation is used, it causes an inversion between sequentially connected memory elements (e.g., by inserting an inversion between them or by connecting the scan in port one of the memory elements to an inverted output of the other) if and only if $$psm\ prm<(1-psm)(1-prm)$$

where psm and prm are the probabilities as defined above for the pair of memory elements. If this method is not used, and hence psm and prm values have not previously been computed, they may be computed at this time for just those pairs of memory elements which have been sequentially connected in the scan chain. Alternatively, for sequentially connected memory elements A and B, one may compute the corresponding probabilities psA and psB of the memory element stimulus value being 1, and corresponding probabilities prA and prB of the memory element result values being 1. This causes an inversion between A and B if and only if $$psA(1-psB)+psB(1-psA)+prA(1-prB)+prB(1-prA)$$
$$>psA\ psB+(1-psB)(1-psA)+prA\ prB+(1-prB)$$
$$(1-prA).$$

The term psA(1−psB)+psB(1−psA) is high when the stimulus values for the memory elements are likely to be different, and the quantity prA(1−prB)+prB(1−prA) is high when the result values for the memory elements are likely to be different. The quantity psA psB+(1−psA)(1−psB) is high when the stimulus values for the memory elements are likely to be the same, and the quantity prA prB+(1−prB)(1−prA) is high when the result values for the memory elements are likely to be the same.

Thus far, the setting of don't care bits has been described using a repeat-fill method after connecting the scan chain in a certain order, with internal inversions set to maximize the probability such that a repeat-fill generate patterns to detect additional faults. Adjacency in the scan chain is influenced only by the "care" bits and determined result values of the subset of patterns used to determine stimulus and result value probabilities for the memory elements. This helps reduce switching during the scan-in and scan-out operations but it does not reduce the switching activity when the result data is stored in the memory elements, replacing the scanned-in data. The switching activity during this result storing operation can be reduced by filling in don't care stimulus bits in the test pattern to minimize the change between the stimulus value and result value for each bit. Thus, if a memory element has a result value that is determined but a stimulus value that is a don't care for a particular test pattern, one chooses to set its input value to match its result value. As a side effect, this can cause the result values for additional memory elements to be determined. Similarly, if the stimulus value for a memory element is specified for a particular test pattern but the result value for that pattern is undetermined, one chooses to have the result value match the stimulus value by assigning other don't care stimuli to the values required for generating that value. As a side effect, it can cause other result bits to take on determined values. By repeating this process, more and more stimulus and result bit values are filled in such a way that switching occurring when the result value is stored is minimized. This process is illustrated in FIG. 3.

Figure 3:
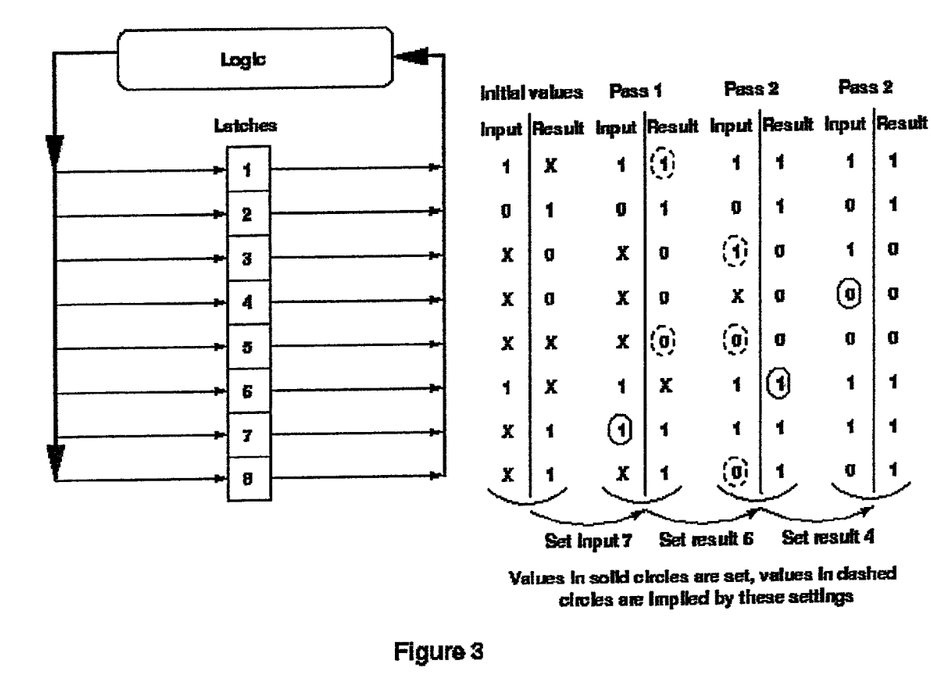
FIG. 3 is a schematic diagram showing a high level description of an added optional step necessary for filling in undetermined input and result values to reduce switching, propagating the consequences of the filled in values to determine other result and input values, and repeating this process until all desired input and result values have been determined.

Referring to FIG. 3, a group of latches which are both inputs and outputs of a logic network is shown, along with an initial test pattern which includes "care" stimulus (input) values (1s and 0s) and don't care stimulus values (Xs), as well as determined result values (1s and 0s) and undetermined result values (Xs). In pass 1, the don't care stimulus value for latch 7 is set to a 1 (solid circle) to match the determined result value for that bit. As a side effect, result values which were previously undetermined for latches 1 and 5 are now determined (dashed circles). In pass 2, don't care values for latches 3, 5, and 8 are set to values (dashed circles) which cause the previously undetermined result value for latch 6 to be 1 (solid circle), matching its care stimulus value. Finally, in pass 3, the don't care stimulus value for latch 4 is set to 0 (solid circle), matching its determined result value.

A probabilistic approach will now be described for reducing switching current. It is sometimes necessary to limit the peak current that occurs during a test sequence. To achieve this, the test patterns are generated and the pair-wise correlation between stimulus and result values for pairs of memory elements are used, as described above. A cost for each trial scan chain ordering is determined as the maximum value over all the test patterns of a maximum number of signal switches occurring during scan-in of stimuli and scan-out of results for the pattern. A signal switch is required for a pattern when the scan-in or scan-out values for a pair of adjacent memory elements are opposite, in the absence of inversion in the scan chain between the memory elements, or when the scan-in or scan-out values for a pair of adjacent memory elements are the same in the presence of an inversion in the scan chain between the memory elements. In the simulated annealing approach, one uses this cost value in addition to the total scan chain length (using modified or unmodified inter-memory element distances), as the overall cost function for the annealing algorithm. Since the scan-in of one pattern overlaps with the scan-out of the preceding pattern, it is advantageous to order the test patterns so that the total signal switching for any last fraction F of a scan-out pattern added to the signal switching count for the corresponding first fraction (1−F) of the following scan-in pattern does not exceed the maximum signal switching count for any individual pattern. Since most patterns have less than the maximum possible signal switching count, generally, this is not difficult to achieve.

In the preferred embodiment of the invention, the process begins with a chip on which all memory elements have been placed (assigned physical locations) and for which the logical functions feeding and fed by each memory element are defined.

1. Using well-known ATPG methods, a set of test patterns for testing a large percentage of the faults on the chip is generated. Each of the patterns includes both specified (care) and unspecified (don't care) stimulus bits. Each of the patterns also determines a set of result values for a subset of memory elements, leaving undetermined the result values for the remainder of the memory element inputs.

2. Next, one repeatedly assigns values to don't care stimulus bits and to undetermined result bits in order to make the stimulus value match the result value for memory elements. As each assignment is made, additional care stimulus values implied by result value assignments (those required to produce an assigned result bit) are computed, and additional result bits (those produced by an assigned input value) are determined. This implication and determination can be performed using well-known value justification and simulation methods, respectively. This process is repeated until no further memory elements exist for which a stimulus value is specified but not the result value, or vice versa, or until a desired number of values have been determined. If, at the conclusion of the process any bits remain unspecified, one merges the test patterns where possible, limiting the entropy (the number of signal switching) in any merged pattern to some user-specified threshold.

3. Modified distances between pairs of memory elements are computed considering pairwise correlations between memory elements. For each pair of memory elements A and B, the probability psm that the stimulus values for A and B are the same in a test pattern and the probability prm that the result values for A and B are the same in a test pattern are computed. Given these probabilities, an unmodified distance $D(A,B)$ between the memory elements, and a constant K equal to one less than the maximum distance multiplier M for any pair of latches, the modified distance between them $D'(A,B)$, is computed as:

$$D'(A,B)=D(A,B)\{1+K[psm(1-prm)+prm(1-psm)]\}.$$

Thus, if psm and prm are both close to 1.0 or are both close to 0.0, the quantity multiplied by the distance $D(A,B)$ will near 1.0, indicating that the effective inter-memory element distance seen by the scan chain ordering algorithm is close to the actual distance between the memory elements. If, however, psm is close to 1.0 and prm is close to 0.0, or vice versa, the multiplier will near M, increasing the effective inter-memory element distance seen by the scan chain ordering algorithm. It is not advantageous to compute distance multipliers for all the pairs of memory elements on a large chip, since the number of such pairs is proportional to the square of the number of memory elements on the chip. Therefore, one computes the multipliers only for pairs of memory elements which are within some user-specified maximum distance D of each other, or computes multipliers for the distances between a memory element and its R closest neighbors, wherein R is a user specified parameter. If the scan chain optimization algorithm in step 4 requires additional multipliers one either computes them or, preferably, simply uses the value of D'(A,B)=M[D(A,B)], thus giving the algorithm an additional incentive to connect a memory element only to nearby memory elements.

4. A prior art scan chain optimization algorithm such as simulated annealing is employed to order the scan chain, using the modified inter-memory element distances computed in step 3.

5. An inversion is inserted in the scan chain between each adjacent pair of memory elements in the scan chain for which $$psm\ prm < (1-psm)(1-prm),$$

for psm and prm as described above.

6. Any remaining don't care stimulus values which were not assigned values by ATPG in step 1 or by the assignments of step 2 are now assigned values using a repeat-fill method.

Figure 4:
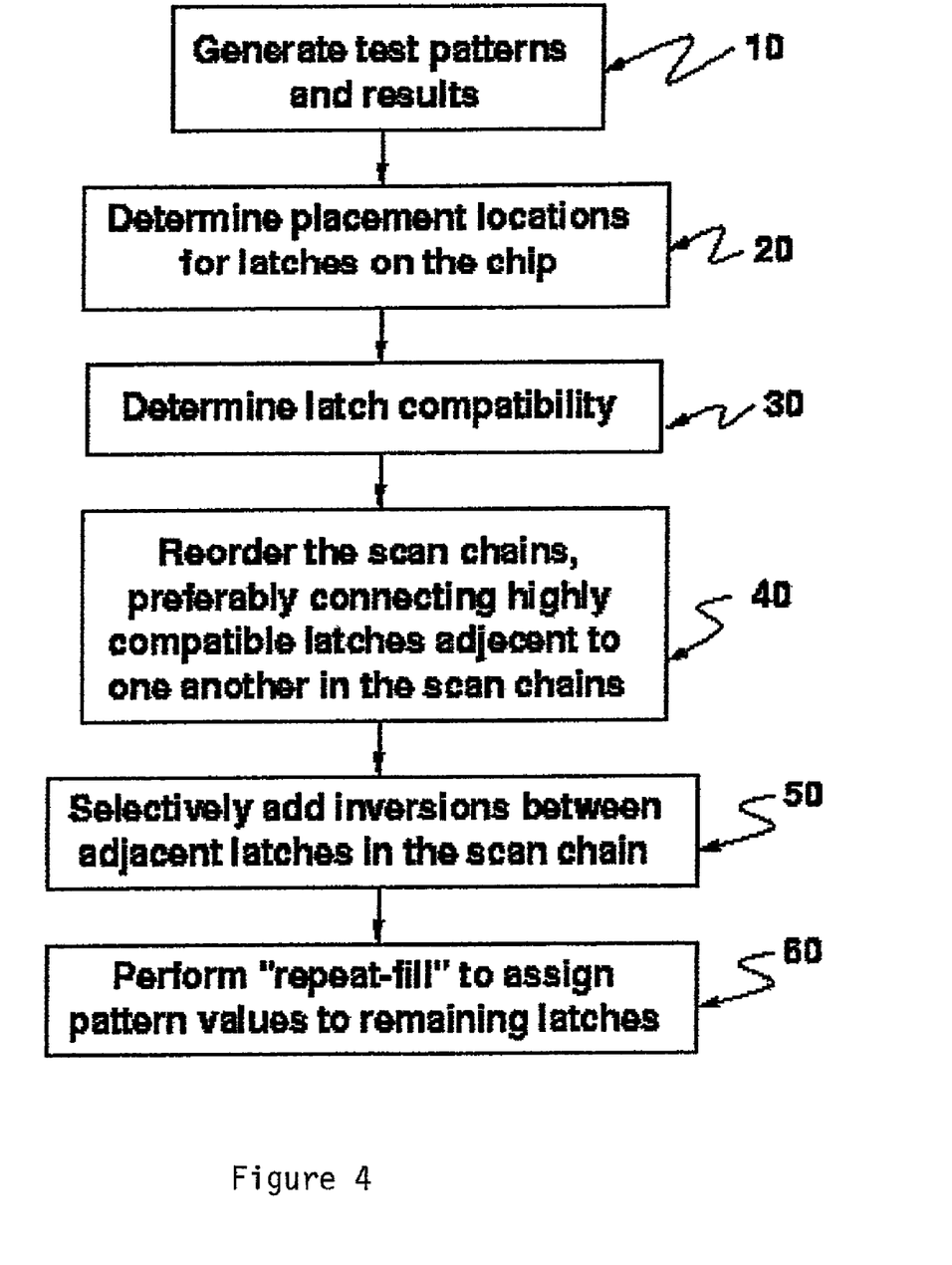
FIG. 4 is a flow chart showing the building blocks for ordering the scan chains in a chip in accordance with the present invention.

Referring now to FIG. 4, there is shown a flow chart that illustrates the major steps describing the preferred embodiment of the present invention.

In step 10, test patterns are generated by way of conventional test pattern generation algorithms, and the effectiveness of those patterns is established by simulation. A complete set of test patterns results from this process or only a small subset used for determining the probabilities that the pattern (stimulus) and result values in each memory element are at 1. This step optionally includes filling in undetermined stimulus values and result values to reduce switching, propagating the consequences of these filled in values to determine other result values and stimulus values and, finally, repeating this process until all (or the desired number) of pattern values and result values have been determined, as described previously.

In step 20, conventional placement methods are used to determine the location on the chip of all the memory elements (generally, the other circuitry on the chip is placed at the same time).

In step 30, the compatibility of memory elements is determined. Two memory elements are compatible when they can be connected adjacently in a scan chain (possibly with an intervening inversion) with a low probability that a switching event will occur as pattern and result data is scanned between them. That is, they are compatible with no intervening inversion between them if it is very likely that for any given test pattern they take the same stimulus value and the same result value, and they are compatible with an intervening inversion between them if it is very likely that for any given test pattern opposite stimulus values and opposite result values are taken.

In step 40, the scan chains are ordered by considering both the memory element placement locations and the compatibility of the memory elements being connected consecutively to form the scan chain. The goal is to connect consecutively in a scan chain memory elements that are physically in near proximity of each other and that are highly compatible. Well known methods, such as simulated annealing, are advantageously used to determine an ordering meeting the stated goals.

In step 50, inversions are introduced between consecutive pairs of memory elements in the scan chain which are more likely to take opposing pattern values and opposing result values than to take the same pattern values and the same result values in any given test pattern. This inversion insertion step may be omitted if a more restrictive definition of compatibility is used than the one that was used, e.g., in step 30, which only considers pairs of memory elements to be compatible when they are likely to take the same pattern values and the same result values in any given test pattern.

Finally, in step 60, a "fill-repeat" process is used to assign pattern values to memory elements which were not previously assigned specific values in the test patterns generated in step 10. These values are assigned so that no switching event takes place while scanning-in the test pattern between the memory element being assigned a value and its closest preceding (or closest following) memory element in the scan chain for which a stimulus value for this test pattern was assigned in step 10.

Hereinafter, is shown an example illustrating the major steps of the inventive method, and which generates various outputs to better explain the process. The example addresses both the embodiment which uses the probabilities for individual memory elements, and the embodiment which considers a pairwise correlation between the memory elements.

The memory element and scan input and output coordinates and a set of 20 stimulus and result patterns are inputted into the program. The scan-in and scan-out are located around the periphery of the chip, and the memory elements are placed at locations in a 20 by 20 grid representing the chip. The lower left square in the chip is (1, 1), with x and y increasing to the right and up, respectively. Thus, the x and y coordinates of the scan-in and scan-out pins which are on the periphery of the chip are all 0 or 21. The following table shows the memory element and scan in/out coordinates.

| Latch | L1 | L2 | L3 | L4 | L5 | L6 | L7 | L8 | L9 | L10 | SI1 | SI2 | SO1 | SO2 |
|---|---|---|---|---|---|---|---|---|---|---|---|---|---|---|
| X | 2 | 12 | 4 | 9 | 13 | 19 | 16 | 19 | 9 | 5 | 0 | 21 | 13 | 0 |
| Y | 8 | 17 | 14 | 9 | 4 | 5 | 11 | 18 | 13 | 4 | 3 | 17 | 0 | 9 |

The following tables show the stimulus and result values for the memory elements. Each column corresponds to the values for the corresponding memory element, thus the first column with header 1 corresponds to memory element L1, the second with header 2 to L2, and so on, with the last column with header 0 corresponding to L10. Note that in a real example the stimulus patterns are generated by a test generation program, and the results patterns are generated by simulation, based on the actual logic of the chip. For the present example, both sets of patterns were generated randomly (by hand). Don't care stimulus values and undetermined result values are represented as "x".

Stimulus Patterns
1234567890
0: 1x0xxx11x0
1: 01xx001xxx
2: x0xx1001x0
3: 1x0001xxx1
4: xx00x101xx
5: 11x10xx000
6: 00xxx001xx
7: 11x00xx11x
8: 1x0x111010
9: 11x10x111x
10: 0x10xx01xx
11: x10x10x11x
12: 1x00xx01x0
13: x10x1xx110
14: 11x00x1xx1
15: 1110xx01x0
16: 0x1x00xxx0
17: 1x00x101x0
18: 10x00xx11x
19: 1x010x00x0

Result Patterns
1234567890
0: 0x11x001x1
1: 10xx1x0xx0
2: 0x11x0xx10
3: 0x111x0xx1
4: 00xx0x111x
5: 01x1x010x1
6: x01x001x0x
7: x001xx01xx
8: 1x00x11x00
9: x001xx0x10
10: 01xxx00011
11: 0x001xx011
12: x00100x101
13: x00x001x1
14: 0xx001xx01
15: x001x001x1
16: 1x0x111x00
17: x001x011x1
18: x01x001xx1
19: 100x001xx1

The following table is a graphical depiction of the locations of the memory elements and scan in/out locations on the chip.

The following table shows the unmodified rectilinear distance (x distance plus y distance) between each memory element, scan-in, and scan-out, and every other memory element, scan in, and scan out. For example, note that in the above tabular depiction, one must go the right 2 spaces and up 6 spaces to go from memory element L1 to memory element L3, for a total distance of 8. Thus, the (L1, L3) and (L3, L1) entries in the table are both 8.0.

|     | L1   | L2   | L3   | L4   | L5   | L6   | L7   | L8   | L9   | L10  | SI1  | SI2  | SO1  | SO2  |
| --- | ---  | ---  | ---  | ---  | ---  | ---  | ---  | ---  | ---  | ---  | ---  | ---  | ---  | ---  |
| L1  | 0.0  | 19.0 | 8.0  | 8.0  | 15.0 | 20.0 | 17.0 | 27.0 | 12.0 | 7.0  | 7.0  | 28.0 | 19.0 | 3.0  |
| L2  | 19.0 | 0.0  | 11.0 | 11.0 | 14.0 | 19.0 | 10.0 | 8.0  | 7.0  | 20.0 | 26.0 | 9.0  | 18.0 | 20.0 |
| L3  | 8.0  | 11.0 | 0.0  | 10.0 | 19.0 | 24.0 | 15.0 | 19.0 | 6.0  | 11.0 | 15.0 | 20.0 | 23.0 | 9.0  |
| L4  | 8.0  | 11.0 | 10.0 | 0.0  | 9.0  | 14.0 | 9.0  | 19.0 | 4.0  | 9.0  | 15.0 | 20.0 | 13.0 | 9.0  |
| L5  | 15.0 | 14.0 | 19.0 | 9.0  | 0.0  | 7.0  | 10.0 | 20.0 | 13.0 | 8.0  | 14.0 | 21.0 | 4.0  | 18.0 |
| L6  | 20.0 | 19.0 | 24.0 | 14.0 | 7.0  | 0.0  | 9.0  | 13.0 | 18.0 | 15.0 | 21.0 | 14.0 | 11.0 | 23.0 |
| L7  | 17.0 | 10.0 | 15.0 | 9.0  | 10.0 | 9.0  | 0.0  | 10.0 | 9.0  | 18.0 | 24.0 | 11.0 | 14.0 | 18.0 |
| L8  | 27.0 | 8.0  | 19.0 | 19.0 | 20.0 | 13.0 | 10.0 | 0.0  | 15.0 | 28.0 | 34.0 | 3.0  | 24.0 | 28.0 |
| L9  | 12.0 | 7.0  | 6.0  | 4.0  | 13.0 | 18.0 | 9.0  | 15.0 | 0.0  | 13.0 | 19.0 | 16.0 | 17.0 | 13.0 |
| L10 | 7.0  | 20.0 | 11.0 | 9.0  | 8.0  | 15.0 | 18.0 | 28.0 | 13.0 | 0.0  | 6.0  | 29.0 | 12.0 | 10.0 |
| SI1 | 7.0  | 26.0 | 15.0 | 15.0 | 14.0 | 21.0 | 24.0 | 34.0 | 19.0 | 6.0  | 0.0  | 35.0 | 16.0 | 6.0  |
| SI2 | 28.0 | 9.0  | 20.0 | 20.0 | 21.0 | 14.0 | 11.0 | 3.0  | 16.0 | 29.0 | 35.0 | 0.0  | 25.0 | 29.0 |
| SO1 | 19.0 | 18.0 | 23.0 | 13.0 | 4.0  | 11.0 | 14.0 | 24.0 | 17.0 | 12.0 | 16.0 | 25.0 | 0.0  | 22.0 |
| SO2 | 3.0  | 20.0 | 9.0  | 9.0  | 18.0 | 23.0 | 18.0 | 28.0 | 13.0 | 10.0 | 6.0  | 29.0 | 22.0 | 0.0  |

In this example, a simple greedy scan chain ordering algorithm is used. For each scan in pin it finds the closest memory element which has not yet been assigned to a scan chain and adds it to the current scan chain. It then finds the closest memory element to this memory element, repeating the process until the scan chain is full (in the present case, there are two scan chains and 10 memory elements, so each scan chain is allowed exactly 5 memory elements). At this point, the closest unassigned scan-out pin is used to terminate the scan chain. In practice, a more sophisticated algorithm such as simulated annealing may be advantageously used to produce a shorter total scan chain length. The following shows the two scan chains, with a total length of 81.0, generated in this manner based on unmodified inter-memory element distances.

Chain 1: SI1, L10, L1, L3, L9, L4, SO2
Chain 2: SI2, L8, L2, L7, L6, L5, SO1

The following shows the stimulus patterns resulting from the application of repeat-fill, based on the scan chain order determined above. Note that the order of the bits herein differs from that shown for the original patterns above, with the headers indicating the scan chain ordering. By way of example, consider the first pattern below. From the order above, L10 is the first memory element in the chain 1 and it has stimulus value 0 in the last column, with header 0, in the first pattern above. So a 0 appears in the first bit in the first column, again with header 0, in the first filled stimulus value. Similarly, the next memory element in chain 1 is L1 (column header 1), and L1 has stimulus value 1 in the first pattern above; thus, the second stimulus bit (again column header 1) in the first filled stimulus pattern must take herein the value 1. Since L3 (column header 3) is the next memory element in chain 1, the 0 stimulus value for L3 in first pattern above requires a 0 for the next stimulus value (again column header 3) in the first filled stimulus pattern. The next memory element in chain 1 is L9 (column header 9), but it has a value X in the first stimulus pattern above, and thus, it is assigned the value 0 (again column header 9) in the first filled stimulus pattern, repeating the value assigned to the previous memory element L3. This process is repeated for the remaining stimulus value bits in all the test patterns. No attempt has been made to minimize switching, either by ordering the scan chain or by introducing inversions. The transition count for each row indicates the number of times the pattern alternates between 0 and 1.

|     | 01394 | 82765 | Transitions |
| --- | --- | --- | --- |
| 0:  | 01000 | 11111 | 2 |
| 1:  | 00000 | 11100 | 1 |
| 2:  | 00000 | 10001 | 2 |
| 3:  | 11000 | 11110 | 2 |
| 4:  | 00000 | 11011 | 2 |
| 5:  | 01101 | 01110 | 5 |
| 6:  | 10000 | 10000 | 2 |
| 7:  | 01110 | 11110 | 3 |
| 8:  | 01011 | 00111 | 4 |
| 9:  | 11111 | 11110 | 1 |
| 10: | 10110 | 11000 | 4 |
| 11: | 00011 | 11101 | 3 |
| 12: | 01000 | 11000 | 3 |
| 13: | 00011 | 11111 | 1 |
| 14: | 11110 | 11110 | 2 |
| 15: | 01110 | 11000 | 3 |
| 16: | 00111 | 00000 | 1 |
| 17: | 01000 | 11011 | 4 |
| 18: | 01110 | 10000 | 3 |
| 19: | 01001 | 00000 | 3 |
| Total transitions: | | | 51 |

The following completed result patterns have values inserted for the undetermined result values from the above result patterns. In practice, these values are normally obtained from simulation of the filled test patterns. In this example, to replicate the effect of likely result values, the value for a memory element has been filled in with 0 if the result probability of being 0 for that memory element in the above patterns is at least $3/4$, filled in with 1 if the result probability of being 1 for that memory element in the above patterns is greater than $3/4$, and are otherwise filled alternately with 0s and 1s to mimic a random result. Specifically, L2 is 0 in 11 out of the 13 cases in which is specified, for a probability of $11/13$ of being 0, and so is set to 0. Similarly, L4 has at least a $3/4$ probability of being 1 and is therefore set to 1, and L6 has at least a $3/4$ probability of being 0 and is, therefore, set to 0. The remaining latches have neither a probability of being 0 nor a probability of being 1 which is at least $3/4$, and are therefore set alternately to 0 and 1. The transition count for each row again indicates the number of times the pattern alternates between 0 and 1. The I/O transition count indicates the number of times a transition occurs between scanning in the previous stimulus and scanning out this result plus the number of times a transition occurs between scanning out this result and scanning in the next stimulus. Thus, the total transition activity for this test pattern set, considering both stimulus scanning, result scanning, and the transitions between them, is 51+91+22=164. This indicates the number of times the scan chain input must be inverted (i.e., producing a switching event which propagates along the scan chain).

|     | 01394 | 82765 | Transitions | I/O Transitions |
| --- | --- | --- | --- | --- |
| 0:  | 10101 | 10001 | 6 | 2 |
| 1:  | 01011 | 00001 | 4 | 1 |
| 2:  | 00111 | 10001 | 3 | 1 |
| 3:  | 10101 | 10001 | 6 | 1 |
| 4:  | 00111 | 10100 | 4 | 2 |
| 5:  | 10011 | 01100 | 4 | 1 |
| 6:  | 10101 | 10100 | 7 | 2 |
| 7:  | 01001 | 10001 | 5 | 1 |
| 8:  | 01000 | 00111 | 3 | 1 |
| 9:  | 00011 | 10010 | 4 | 1 |
| 10: | 10111 | 01000 | 4 | 1 |
| 11: | 10010 | 01101 | 6 | 1 |
| 12: | 10001 | 10100 | 5 | 0 |
| 13: | 10011 | 10000 | 3 | 2 |
| 14: | 10100 | 00110 | 5 | 1 |
| 15: | 10011 | 10000 | 3 | 1 |
| 16: | 01000 | 10111 | 4 | 0 |

-continued

|     | 01394 | 82765 | Transitions | I/O Transitions |
|-----|-------|-------|-------------|-----------------|
| 17: | 10011 | 10100 | 5           | 2               |
| 18: | 11101 | 10100 | 5           | 1               |
| 19: | 11001 | 10100 | 5           | 0               |
| Total Transitions: |  |  | 91 | 22 |

Below is shown the probability for each memory element that the stimulus bit is 1, given that its value is not X; the probability that the result bit is 1, since its value is not X; and the probability that the stimulus and result bits are the same, in view that neither is X. For example, for memory element 1, there are 16 out of the 20 patterns in which memory element L1 has a non-X value, and in 12 of these cases its value is 1. Thus, the probability that the stimulus bit is 1 is $12/16$ or 75%. Similarly the probability that its result bit is 1 is $4/12$ or 33.3%. Finally, there are 9 patterns for which both the stimulus and result are non-X, and they are the same in 3 of these cases, giving a probability that they are the same of $3/9$ or 33.3%.

Following is the scan chain ordering produced using the same greedy algorithm based on the adjusted distances listed above. Inversions are introduced between memory elements A and B whenever:

$$ps(A)(1-ps(B))+ps(B)(1-ps(A))+pr(A)(1-pr(B))+pr(B)(1-pr(A))>ps(A)ps(B)+(1-ps(B))(1-ps(A))+pr(A)pr(B)+(1-pr(B))(1-pr(A))$$

where ps(X) and pr(X) are the probabilities that the stimulus and result for memory element X are 1, respectively. In this case, the total scan chain length (the sum of the unadjusted distances between sequentially connected memory elements and scan-in and scan-out pins) is still 81.0, the same as in the unoptimized case; the algorithm simply chose an alternative equal length chain.

Scan chain order (based on probability adjusted distances)
Chain 1: SI1, L10, invert, L1, invert, L4, invert, L9, invert, L3, SO2
Chain 2: SI2, invert, L8, L2, invert, L7, L6, L5, SO1

The following table shows the filled stimulus patterns based on the above ordering and inversion. Note that in this case, if the previous memory element in the chain had the value 0 (or 1) and there is an inversion between the previous memory element and the current memory element, the repeat

| Latch      | L1   | L2   | L3   | L4   | L5   | L6   | L7   | L8   | L9   | L10  |
|------------|------|------|------|------|------|------|------|------|------|------|
| Pstim = 1  | 75.0 | 72.7 | 25.0 | 25.0 | 30.8 | 44.4 | 38.5 | 81.2 | 85.7 | 16.7 |
| Presult = 1| 33.3 | 15.4 | 33.3 | 76.9 | 40.0 | 21.4 | 50.0 | 70.0 | 50.0 | 70.6 |
| Pmatch     | 33.3 | 37.5 | 60.0 | 37.5 | 57.1 | 60.0 | 30.0 | 80.0 | 66.7 | 41.7 |

The following table shows the memory element-to-memory element distances with an adjustment to make memory elements which should not appear adjacent in the scan chain farther apart. The adjusted distance from memory element A to B is computed as:

$$D'(A,B)=D(A,B)\{1+3[pm(A)(1-pm(B))+pm(B)(1-pm(A))]\}$$

where D(A,B) is the unadjusted distance as given above and pm(X) is the probability that the result and stimulus for memory element X match are the same.

fill process will replace an x with the opposite value, i.e., 1 (or 0). The phase header indicates for each column the net inversion between the scan-in port and the memory element, thus a change from + to − or from − to + between two columns indicates an inversion in the scan chain.

|        | +−+−+ | −−+++ |             |
|--------|-------|-------|-------------|
| Phase: | 01493 | 82765 | Transitions |
| 0:     | 01010 | 11111 | 1           |
| 1:     | 00101 | 01100 | 3           |

|     | L1   | L2   | L3   | L4   | L5   | L6   | L7   | L8   | L9   | L10  | SI1  | SI2  | SO1  | SO2  |
|-----|------|------|------|------|------|------|------|------|------|------|------|------|------|------|
| L1  | 0.0  | 45.1 | 20.8 | 19.0 | 38.6 | 52.0 | 39.1 | 75.6 | 32.0 | 16.9 | 7.0  | 28.0 | 19.0 | 3.0  |
| L2  | 45.1 | 0.0  | 28.3 | 26.5 | 35.8 | 48.9 | 23.5 | 21.8 | 18.4 | 48.8 | 26.0 | 9.0  | 18.0 | 20.0 |
| L3  | 20.8 | 28.3 | 0.0  | 25.8 | 46.7 | 58.6 | 39.3 | 44.1 | 14.4 | 28.1 | 15.0 | 20.0 | 23.0 | 9.0  |
| L4  | 19.0 | 26.5 | 25.8 | 0.0  | 23.0 | 36.0 | 21.1 | 51.8 | 10.5 | 21.9 | 15.0 | 20.0 | 13.0 | 9.0  |
| L5  | 38.6 | 35.8 | 46.7 | 23.0 | 0.0  | 17.2 | 25.9 | 47.4 | 31.6 | 20.3 | 14.0 | 21.0 | 4.0  | 18.0 |
| L6  | 52.0 | 48.9 | 58.6 | 36.0 | 17.2 | 0.0  | 23.6 | 30.2 | 43.2 | 38.2 | 21.0 | 14.0 | 11.0 | 23.0 |
| L7  | 39.1 | 23.5 | 39.3 | 21.1 | 25.9 | 23.6 | 0.0  | 28.6 | 24.3 | 43.2 | 24.0 | 11.0 | 14.0 | 18.0 |
| L8  | 75.6 | 21.8 | 44.1 | 51.8 | 47.4 | 30.2 | 28.6 | 0.0  | 33.0 | 74.2 | 34.0 | 3.0  | 24.0 | 28.0 |
| L9  | 32.0 | 18.4 | 14.4 | 10.5 | 31.6 | 43.2 | 24.3 | 33.0 | 0.0  | 33.6 | 19.0 | 16.0 | 17.0 | 13.0 |
| L10 | 16.9 | 48.8 | 28.1 | 21.9 | 20.3 | 38.2 | 43.2 | 74.2 | 33.6 | 0.0  | 6.0  | 29.0 | 12.0 | 10.0 |
| SI1 | 7.0  | 26.0 | 15.0 | 15.0 | 14.0 | 21.0 | 24.0 | 34.0 | 19.0 | 6.0  | 0.0  | 35.0 | 16.0 | 6.0  |
| SI2 | 28.0 | 9.0  | 20.0 | 20.0 | 21.0 | 14.0 | 11.0 | 3.0  | 16.0 | 29.0 | 35.0 | 0.0  | 25.0 | 29.0 |
| SO1 | 19.0 | 18.0 | 23.0 | 13.0 | 4.0  | 11.0 | 14.0 | 24.0 | 17.0 | 12.0 | 16.0 | 25.0 | 0.0  | 22.0 |
| SO2 | 3.0  | 20.0 | 9.0  | 9.0  | 18.0 | 23.0 | 18.0 | 28.0 | 13.0 | 10.0 | 6.0  | 29.0 | 22.0 | 0.0  |

-continued

| Phase: | +-+-+<br>01493 | --+++<br>82765 | Transitions |
|---|---|---|---|
| 2: | 01010 | 10001 | 3 |
| 3: | 11010 | 00110 | 2 |
| 4: | 01010 | 11011 | 1 |
| 5: | 01101 | 01000 | 2 |
| 6: | 10101 | 10000 | 2 |
| 7: | 11010 | 11000 | 1 |
| 8: | 01010 | 00111 | 0 |
| 9: | 01110 | 11110 | 4 |
| 10: | 00011 | 11000 | 3 |
| 11: | 10110 | 11001 | 2 |
| 12: | 01010 | 11000 | 0 |
| 13: | 01010 | 11001 | 1 |
| 14: | 11010 | 01110 | 4 |
| 15: | 01011 | 11000 | 1 |
| 16: | 00101 | 11000 | 1 |
| 17: | 01010 | 11011 | 1 |
| 18: | 01010 | 10110 | 2 |
| 19: | 01100 | 00000 | 3 |
| Total transitions: | | | 37 |

| Phase: | +-+-+<br>01493 | --+++<br>82765 | Transitions | I/O Transitions |
|---|---|---|---|---|
| 0: | 10101 | 10001 | 3 | 0 |
| 1: | 01101 | 00001 | 3 | 0 |
| 2: | 00111 | 10001 | 6 | 0 |
| 3: | 10101 | 10001 | 3 | 2 |
| 4: | 00111 | 10100 | 4 | 1 |
| 5: | 10101 | 01100 | 3 | 1 |
| 6: | 10101 | 10100 | 2 | 1 |
| 7: | 01100 | 10001 | 5 | 1 |
| 8: | 01000 | 00111 | 2 | 1 |
| 9: | 00110 | 10010 | 5 | 1 |
| 10: | 10111 | 01000 | 3 | 1 |
| 11: | 10010 | 01101 | 6 | 2 |
| 12: | 10100 | 10100 | 3 | 2 |
| 13: | 10110 | 10000 | 3 | 1 |
| 14: | 10001 | 00110 | 4 | 1 |
| 15: | 10110 | 10000 | 3 | 0 |
| 16: | 01000 | 10111 | 3 | 1 |
| 17: | 10110 | 10100 | 3 | 1 |
| 18: | 11101 | 10100 | 4 | 1 |
| 19: | 11100 | 10100 | 5 | 0 |
| Total Transitions: | | | 73 | 18 |

The following shows the result patterns completed as above, and the result scanning transitions for this ordering and inversion selection. Note that the total transitions are now 37+73+18=128, a 22% reduction from the total of 164 for the unoptimized case.

The following tables show the probability for each pair of memory elements that their stimuli and results match, respectively. As above, the probability is computed as a percentage of the number of patterns in which stimuli or results are known for both memory elements.

|  | L1 | L2 | L3 | L4 | L5 | L6 | L7 | L8 | L9 | L10 |
|---|---|---|---|---|---|---|---|---|---|---|
| L1 | 100.0 | 75.0 | 11.1 | 36.4 | 30.0 | 100.0 | 54.5 | 58.3 | 80.0 | 30.0 |
| L2 | 75.0 | 100.0 | 33.3 | 50.0 | 33.3 | 50.0 | 83.3 | 55.6 | 66.7 | 40.0 |
| L3 | 11.1 | 33.3 | 100.0 | 57.1 | 33.3 | 16.7 | 50.0 | 40.0 | 0.0 | 66.7 |
| L4 | 36.4 | 50.0 | 57.1 | 100.0 | 57.1 | 0.0 | 75.0 | 10.0 | 25.0 | 42.9 |
| L5 | 30.0 | 33.3 | 33.3 | 57.1 | 100.0 | 50.0 | 33.3 | 55.6 | 57.1 | 37.5 |
| L6 | 100.0 | 50.0 | 16.7 | 0.0 | 50.0 | 100.0 | 50.0 | 33.3 | 50.0 | 60.0 |
| L7 | 54.5 | 83.3 | 50.0 | 75.0 | 33.3 | 50.0 | 100.0 | 27.3 | 100.0 | 75.0 |
| L8 | 58.3 | 55.6 | 40.0 | 10.0 | 55.6 | 33.3 | 27.3 | 100.0 | 85.7 | 33.3 |
| L9 | 80.0 | 66.7 | 0.0 | 25.0 | 57.1 | 50.0 | 100.0 | 85.7 | 100.0 | 33.3 |
| L10 | 30.0 | 40.0 | 66.7 | 42.9 | 37.5 | 60.0 | 75.0 | 33.3 | 33.3 | 100.0 |

Probabilities that the Results Match

|  | L1 | L2 | L3 | L4 | L5 | L6 | L7 | L8 | L9 | L10 |
|---|---|---|---|---|---|---|---|---|---|---|
| L1 | 100.0 | 20.0 | 14.3 | 28.6 | 57.1 | 75.0 | 66.7 | 60.0 | 14.3 | 18.2 |
| L2 | 20.0 | 100.0 | 77.8 | 14.3 | 83.3 | 77.8 | 50.0 | 0.0 | 60.0 | 40.0 |
| L3 | 14.3 | 77.8 | 100.0 | 45.5 | 42.9 | 45.5 | 50.0 | 28.6 | 57.1 | 46.2 |
| L4 | 28.6 | 14.3 | 45.5 | 100.0 | 50.0 | 0.0 | 22.2 | 87.5 | 66.7 | 66.7 |
| L5 | 57.1 | 83.3 | 42.9 | 50.0 | 100.0 | 83.3 | 14.3 | 0.0 | 66.7 | 25.0 |
| L6 | 75.0 | 77.8 | 45.5 | 0.0 | 83.3 | 100.0 | 54.5 | 28.6 | 28.6 | 15.4 |
| L7 | 66.7 | 50.0 | 50.0 | 22.2 | 14.3 | 54.5 | 100.0 | 37.5 | 16.7 | 46.2 |
| L8 | 60.0 | 0.0 | 28.6 | 87.5 | 0.0 | 28.6 | 37.5 | 100.0 | 25.0 | 62.5 |
| L9 | 14.3 | 60.0 | 57.1 | 66.7 | 66.7 | 28.6 | 16.7 | 25.0 | 100.0 | 50.0 |
| L10 | 18.2 | 40.0 | 46.2 | 66.7 | 25.0 | 15.4 | 46.2 | 62.5 | 50.0 | 100.0 |

The following table shows the memory element to memory element distances with an adjustment to make memory elements which should not appear adjacent in the an chain farther apart. The adjusted distance from memory element A to B is based on the above pair-wise correlation, and is computed as:

$$D'(A,B)=D(A,B)\{1+3[psm(A,B)(1-prm(A,B))+prm(A,B)(1-psm(A,B))]\}$$

where D(A,B) is the unadjusted distance, psm(A,B) is the probability that the stimuli for memory elements A and B match, and prm(A,B) is the probability that the results for memory elements A and B match.

|     | L1   | L2   | L3   | L4   | L5   | L6   | L7   | L8   | L9   | L10  | SI1  | SI2  | SO1  | SO2  |
| --- | ---- | ---- | ---- | ---- | ---- | ---- | ---- | ---- | ---- | ---- | ---- | ---- | ---- | ---- |
| L1  | 0.0  | 56.0 | 13.3 | 18.6 | 38.8 | 35.0 | 41.7 | 66.2 | 37.7 | 14.8 | 7.0  | 28.0 | 19.0 | 3.0  |
| L2  | 56.0 | 0.0  | 30.6 | 27.5 | 39.7 | 47.5 | 25.0 | 21.3 | 16.9 | 48.8 | 26.0 | 9.0  | 18.0 | 20.0 |
| L3  | 13.3 | 30.6 | 0.0  | 25.2 | 46.1 | 57.8 | 37.5 | 45.1 | 16.3 | 27.9 | 15.0 | 20.0 | 23.0 | 9.0  |
| L4  | 18.6 | 27.5 | 25.2 | 0.0  | 22.5 | 14.0 | 26.2 | 64.6 | 11.0 | 23.1 | 15.0 | 20.0 | 13.0 | 9.0  |
| L5  | 38.8 | 39.7 | 46.1 | 22.5 | 0.0  | 17.5 | 21.4 | 53.3 | 31.6 | 18.5 | 14.0 | 21.0 | 4.0  | 18.0 |
| L6  | 35.0 | 47.5 | 57.8 | 14.0 | 17.5 | 0.0  | 22.5 | 29.7 | 45.0 | 40.6 | 21.0 | 14.0 | 11.0 | 23.0 |
| L7  | 41.7 | 25.0 | 37.5 | 26.2 | 21.4 | 22.5 | 0.0  | 23.3 | 31.5 | 46.0 | 24.0 | 11.0 | 14.0 | 18.0 |
| L8  | 66.2 | 21.3 | 45.1 | 64.6 | 53.3 | 29.7 | 23.3 | 0.0  | 45.5 | 73.5 | 34.0 | 3.0  | 24.0 | 28.0 |
| L9  | 37.7 | 16.8 | 16.3 | 11.0 | 31.6 | 45.0 | 31.5 | 45.5 | 0.0  | 32.5 | 19.0 | 16.0 | 17.0 | 13.0 |
| L10 | 14.8 | 48.8 | 27.9 | 23.1 | 18.5 | 40.6 | 46.0 | 73.5 | 32.5 | 0.0  | 6.0  | 29.0 | 12.0 | 10.0 |
| SI1 | 7.0  | 26.0 | 15.0 | 15.0 | 14.0 | 21.0 | 24.0 | 34.0 | 19.0 | 6.0  | 0.0  | 35.0 | 16.0 | 6.0  |
| SI2 | 28.0 | 9.0  | 20.0 | 20.0 | 21.0 | 14.0 | 11.0 | 3.0  | 16.0 | 29.0 | 35.0 | 0.0  | 25.0 | 29.0 |
| SO1 | 19.0 | 18.0 | 23.0 | 13.0 | 4.0  | 11.0 | 14.0 | 24.0 | 17.0 | 12.0 | 16.0 | 25.0 | 0.0  | 22.0 |
| SO2 | 3.0  | 20.0 | 9.0  | 9.0  | 18.0 | 23.0 | 18.0 | 28.0 | 13.0 | 10.0 | 6.0  | 29.0 | 22.0 | 0.0  |

The following is the scan chain order determined using the same greedy algorithm, based on the correlation-adjusted distance listed above. An inversion is introduced between memory elements A and B wherever needed:

$$(1-psm(A,B))(1-prm(A,B))>psm(A,B)prm(A,B)$$

The total scan chain length (the sum of the unadjusted distances between sequentially connected memory elements and scan-in and scan-out pins) has increased to 89.0, only a slight increase over the previous length of 81.0.

Chain 1: SI1, L10, invert, L1, invert, L3, invert, L9, invert, L4, SO2

Chain 2: SI2, L8, invert, L2, L7, invert, L5, L6, SO1

The following tables show the filled stimulus patterns and completed result patterns based on the above ordering and inversion. The repeat fill process deals with inversions as described above for the probability-adjusted case. The transition count is now 30+61+19=110, which is a 33% reduction from the unoptimized case and a further 14% reduction from the count of 128 for the previous probability-adjusted method.

| Phase: | +−+−+<br>01394 | +−−++<br>82756 | Transitions |
| --- | --- | --- | --- |
| 0: | 01010 | 10100 | 1 |
| 1: | 00101 | 01100 | 1 |
| 2: | 01010 | 10010 | 1 |
| 3: | 11010 | 01101 | 2 |
| 4: | 01010 | 10011 | 0 |
| 5: | 01001 | 01100 | 1 |
| 6: | 10101 | 10010 | 1 |
| 7: | 11010 | 11100 | 2 |
| 8: | 01010 | 01111 | 1 |
| 9: | 01011 | 11100 | 2 |
| 10: | 10100 | 10011 | 1 |
| 11: | 01010 | 11110 | 3 |
| 12: | 01010 | 10011 | 0 |
| 13: | 01010 | 11111 | 2 |
| 14: | 11010 | 11100 | 2 |
| 15: | 01100 | 11011 | 4 |
| 16: | 00101 | 10000 | 2 |
| 17: | 01010 | 10011 | 0 |
| 18: | 01010 | 10000 | 1 |
| 19: | 01011 | 01000 | 3 |
| Total Transitions: | | | 30 |

Result Patterns

| Phase: | +−+−+<br>01394 | +−−++<br>82756 | Transitions | I/O Transitions |
| --- | --- | --- | --- | --- |
| 0: | 10101 | 10010 | 1 | 1 |
| 1: | 01011 | 00010 | 3 | 0 |
| 2: | 00111 | 10010 | 4 | 0 |
| 3: | 10101 | 10010 | 1 | 1 |
| 4: | 00111 | 10100 | 4 | 2 |
| 5: | 10011 | 01100 | 2 | 0 |
| 6: | 10101 | 10100 | 1 | 2 |
| 7: | 01001 | 10010 | 2 | 0 |
| 8: | 01000 | 00111 | 5 | 1 |
| 9: | 00011 | 10001 | 5 | 0 |
| 10: | 10111 | 01000 | 4 | 1 |
| 11: | 10010 | 01110 | 3 | 2 |
| 12: | 10001 | 10100 | 3 | 1 |
| 13: | 10011 | 10000 | 3 | 2 |
| 14: | 10100 | 00101 | 4 | 2 |
| 15: | 10011 | 10000 | 3 | 1 |
| 16: | 01000 | 10111 | 4 | 0 |
| 17: | 10011 | 10100 | 3 | 2 |
| 18: | 11101 | 10100 | 3 | 1 |
| 19: | 11001 | 10100 | 3 | 0 |
| Total Transitions: | | | 61 | 19 |

Whereas the present invention has been described in terms of a preferred embodiment, it will be understood by those skilled in the art that numerous changes and modifications to the algorithm may be introduced without departing from the spirit of the invention, all of which fall within the scope of the appended claims.

What is claimed is:

1. A method for reducing switching activity during a test scan operation of at least one scan chain in an integrated circuit (IC) comprising the steps of:
   a) determining stimulus and result value probabilities for a plurality of memory elements in said IC; and
   b) connecting said memory elements to from at least one scan chain based on said stimulus and result value probabilities to reduce the switching activity as determined by said stimulus and result value probabilities and by ordering said memory elements within said at least one scan chain, wherein connecting said memory elements includes sequentially connecting at least one pair of said memory elements, said at least one pair of memory elements being determined by computing a value extracted from the equation:

$$D(A,B)\{1+K[pm(A)(1-pm(B))+pm(B)(1-pm(A))]\},$$
   wherein

D(A,B) is a distance between said pair of memory elements, pm(A) is a probability that said stimulus and result values of a first memory element of said pair are the same, pm(B) is a probability that said stimulus and result values of a second memory element of said pair are the same, and K is a constant value.

2. The method of claim 1, wherein said stimulus and result value probabilities are determined by generating and simulating a set of test patterns for said IC.

3. The method of claim 1, wherein each of said stimulus and result value probabilities comprise a probability that a stimulus value for a selected memory element coincides with a result value for said selected memory element.

4. The method of claim 3, wherein a probability that at least one pair of said memory elements will be connected sequentially in said at least one scan chain increases with a probability that stimulus and the result values coincide for both elements of said pair, said probability of stimulus and result values coinciding for both elements of said pair being computed from said probability that the stimulus value for a first memory element of said pair coincides with the result value for said first memory element of said pair and from said probability that the stimulus value for a second memory element of said pair coincides with the result value for said second memory element of said pair.

5. The method of claim 1, wherein each of said stimulus and result value probabilities comprise a probability that a stimulus value for a selected memory element is the opposite of a result value for said selected memory element.

6. The method of claim 5, wherein the probability that at least one pair of said memory elements will be connected sequentially in said at least one scan chains increases with a probability that stimulus and result values are opposite for both elements of said pair, said probability of stimulus and result values being opposite for both elements of said pair being computed from said probability that the stimulus value for a first memory element of said pair is the opposite of the result value for said first memory element of said pair and from said probability that the stimulus value for a second memory element of said pair is the opposite of the result value for said second memory element of said pair.

7. The method of claim 1, wherein said stimulus and result probabilities comprise for at least one pair of memory elements whose first element has a stimulus value s1 and a result value r1 and whose second element has a stimulus value s2 and a result value r2, a probability that the stimulus value s1 equals s2 and a probability that the result value r1 equals r2.

8. The method of claim 7, wherein the probability that said at least one pair of memory elements will be connected sequentially in said at least one scan chain increases with a probability that the stimulus value s1 equals s2 and the result value r1 equals r2, said probability that the stimulus value s1 equals s2 and the result value r1 equals r2 being computed from said probability that the stimulus value s1 equals s2 and said probability that the result value r1 equals r2.

9. The method of claim 7, wherein the probability that said at least one pair of memory elements will be connected sequentially in said at least one scan chain increases with a probability that the stimulus value s1 differs from s2 and the result value r1 differs from r2, said probability that the stimulus value s1 differs from s2 and the result value r1 differs from r2 being computed from said probability that the stimulus value s1 equals s2 and said probability that the result value r1 equals r2.

10. The method of claim 9, wherein said sequential connection of said pair of memory elements includes an inversion between said pair of memory elements.

11. The method of claim 7, wherein the probability that at least one pair of said memory elements will be connected sequentially in at least one of said scan chains decreases with a probability that the stimulus value s1 differs from s2 and the result value r1 equals r2, said probability that the stimulus value s1 differs from s2 and the result value r1 equals r2 being computed from said probability that the stimulus value s1 equals s2 and said probability that the result value r1 equals r2.

12. The method of claim 7, wherein the probability that at least one pair of said memory elements will be connected sequentially in at least one of said scan chains decreases with a probability that the stimulus value s1 equals s2 and the result value r1 differs from r2, said probability that the stimulus value s1 equals s2 and the result value r1 differs from r2 being computed from said probability that the stimulus value s1 equals s2 and said probability that the result value r1 equals r2.

13. The method of claim 1, wherein test patterns are generated for said IC, at least one of said test patterns including a stimulus value which is undetermined for at least one of said memory elements, said undetermined stimulus value being set to a value which does not cause switching during a scan operation between said memory element and the nearest closest preceding memory element in said chain for which a value was determined by said test pattern.

14. The method of claim 1, wherein test patterns are generated for said IC, at least one of said test patterns including a stimulus value which is undetermined for at least one of said memory elements, said undetermined stimulus value being set to a value which does not cause switching during a scan operation between said memory element and the nearest closest following memory element in said chain for which a value was determined by said test pattern.

15. The method of claim 1, wherein test patterns are generated for said IC, at least one of said test patterns including a stimulus value which is undetermined for at least one of said memory elements and a result value which is determined for said at least one memory element, said undetermined stimulus value being set to coincide with said determined result value.

16. The method of claim 1, wherein test patterns are generated for said IC, at least one of said test patterns including a stimulus value which is determined for at least one of said plurality of memory elements, a result value which is undetermined for at least one of said plurality of memory elements, and stimulus values which are undetermined for at least another memory element, and wherein at least one of said undetermined stimulus values is set to a value which causes said undetermined result value to have a value that coincides to said determined stimulus value.

17. A method for reducing switching activity during a test scan operation of at least one scan chain in an integrated circuit (IC) comprising the steps of:
  a) determining stimulus and result value probabilities for a plurality of memory elements in said IC; and
  b) connecting said memory elements to form at least one scan chain based on said stimulus and result value probabilities, thereby reducing the switching activity as determined by said stimulus and result value probabilities and by ordering said memory elements within said at least one scan chain, wherein connecting said pair of memory elements is determined by computing a value determined by the equation:

$$D(A,B)\{1+K[ps(1-pr)+pr(1-ps)]\}, \text{ wherein}$$

D(A,B) is a distance between said pair of memory elements, ps is said probability that s1 equals s2, pr is said probability that r1 equals r2, and K is a constant value.

18. The method of claim 17, wherein a set of test patterns is generated for said IC, at least one pair of members of said test pattern set are merged to reduce the number of elements in said set of test patterns, a total switching activity during scan-in of said merged pattern is computed, and said merging is rejected if said computed total switching activity exceeds a predetermined limit.

19. The method of claim 17, wherein a set of test patterns is generated for said IC, a total switching activity during scan-out of result values for at least one member of said test pattern is computed, and said test pattern is rejected if said total computed switching activity exceeds a predetermined limit.

20. The method of claim 17, wherein a maximum switching activity during scan-in or scan-out of any test pattern of said set of test patterns is determined for at least one candidate scan chain ordering, said candidate scan chain ordering being rejected if said maximum switching activity exceeds said predetermined limit.

21. A program storage device readable by a machine, tangibly embodying a program of instructions executable by the machine to perform method steps for reducing the switching activity during a test scan operation of at least one scan chain in an integrated circuit (IC), the method steps comprising:
  a) determining stimulus and result value probabilities for a plurality of memory elements in said IC; and
  b) connecting said memory elements to form at least one scan chain based on said stimulus and result value probabilities to reduce the switching activity as determined by said stimulus and result value probabilities and by ordering said memory elements within said at least one scan chain, wherein connecting said memory elements includes sequentially connecting at least one pair of said memory elements, said at least one pair of memory elements being determined by computing a value extracted from the equation:

$$D(A,B)\{1+K[pm(A)(1-pm(B))+pm(\quad B)(1-pm(A))]\}, \text{ wherein}$$

D(A,B) is a distance between said pair of memory elements, pm(A) is a probability that said stimulus and result values of a first memory element of said pair are the same, pm(B) is a probability that said stimulus and result values of a second memory element of said pair are the same, and K is a constant value.

* * * * *